(12) United States Patent
Stephenson et al.

(10) Patent No.: US 6,916,683 B2
(45) Date of Patent: Jul. 12, 2005

(54) METHODS OF FABRICATING A MOLDED BALL GRID ARRAY

(75) Inventors: William R. Stephenson, Nampa, ID (US); Bret K. Street, Meridian, ID (US); Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 10/230,569

(22) Filed: Aug. 29, 2002

(65) Prior Publication Data

US 2002/0195708 A1 Dec. 26, 2002

Related U.S. Application Data

(63) Continuation-in-part of application No. 10/120,814, filed on Apr. 11, 2002, which is a continuation of application No. 09/568,676, filed on May 11, 2000, now Pat. No. 6,400,574.

(51) Int. Cl.[7] ............................................. H01L 21/48
(52) U.S. Cl. ........................ 438/108; 438/127; 438/613
(58) Field of Search ............................... 257/738, 778, 257/779; 438/106–108, 121, 124, 125–127, 612, 613; 29/832, 841, 855

(56) References Cited

U.S. PATENT DOCUMENTS

| | | | | | |
|---|---|---|---|---|---|
| 5,276,289 | A | * | 1/1994 | Satoh et al. | 174/260 |
| 5,450,283 | A | * | 9/1995 | Lin et al. | 361/704 |
| 5,777,382 | A | * | 7/1998 | Abbott et al. | 257/695 |
| 5,824,252 | A | * | 10/1998 | Miyajima | 264/272.17 |
| 5,841,192 | A | * | 11/1998 | Exposito | 257/701 |
| 5,888,850 | A | * | 3/1999 | Havens et al. | 438/127 |
| 5,891,384 | A | * | 4/1999 | Miyajima | 264/511 |
| 5,949,132 | A | * | 9/1999 | Libres et al. | 257/666 |
| 5,998,243 | A | * | 12/1999 | Odashima et al. | 438/127 |
| 6,081,997 | A | * | 7/2000 | Chia et al. | 29/841 |
| 6,187,243 | B1 | * | 2/2001 | Miyajima | 264/272.15 |
| 6,229,209 | B1 | * | 5/2001 | Nakamura et al. | 257/737 |
| 6,249,053 | B1 | * | 6/2001 | Nakata et al. | 257/738 |
| 6,326,700 | B1 | * | 12/2001 | Bai et al. | 257/790 |
| 6,365,499 | B1 | * | 4/2002 | Nakamura et al. | 438/613 |
| 6,383,846 | B1 | * | 5/2002 | Shen et al. | 438/127 |
| 6,400,574 | B1 | * | 6/2002 | Stephenson et al. | 361/760 |
| 6,459,163 | B1 | * | 10/2002 | Bai | 257/787 |
| 6,503,781 | B2 | * | 1/2003 | Stephenson et al. | 438/127 |
| 2002/0008311 | A1 | * | 1/2002 | Kimura | 257/690 |

FOREIGN PATENT DOCUMENTS

JP          07022538  A  *  1/1995  ........... H01L/23/12

* cited by examiner

*Primary Examiner*—Alonzo Chambliss
(74) *Attorney, Agent, or Firm*—Fletcher Yoder

(57) ABSTRACT

A method and apparatus for encapsulating a BGA package. Specifically, a BGA package is encapsulated after the balls are attached to the package. The backside of the package having the balls disposed thereon may be completely covered by the encapsulant. The encapsulant is disposed in direct contact about a portion of the balls. A liner is provided to facilitate the formation of an unencapsulated portion of each ball. The unencapsulated portion may be used to couple the package to a system.

27 Claims, 5 Drawing Sheets

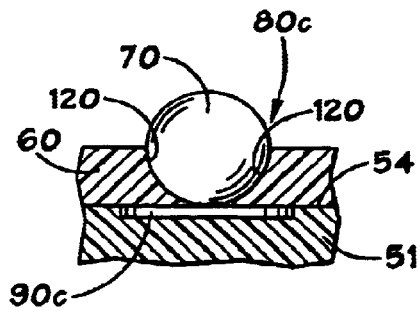
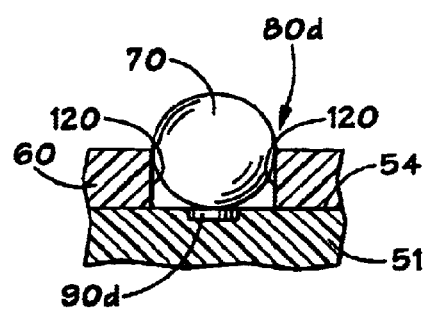
FIG. 7C    FIG. 7D
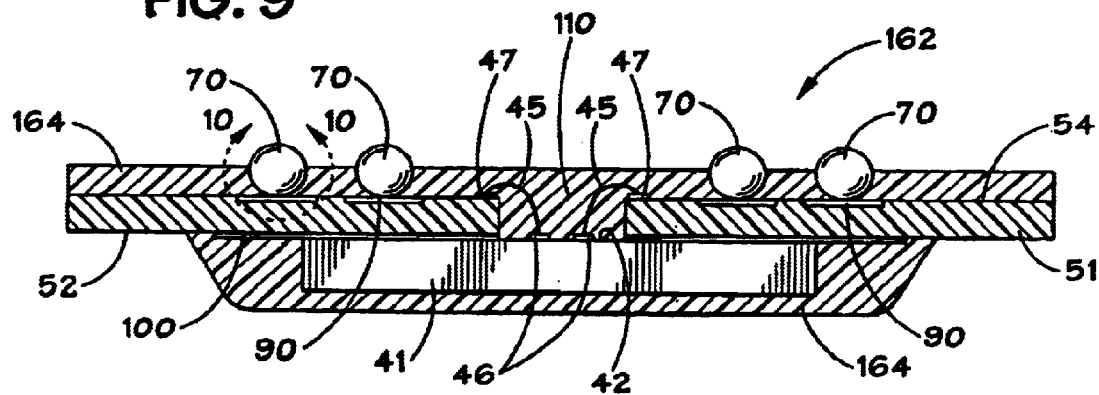
FIG. 9
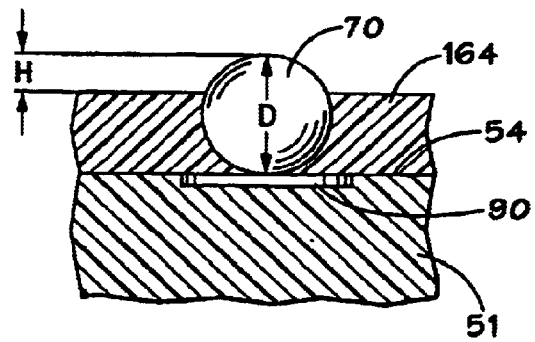
FIG. 10

METHODS OF FABRICATING A MOLDED BALL GRID ARRAY

CROSS-REFERENCE TO RELATED APPLICATION

The present application is a Continuation-in-part of application Ser. No. 10/120,814 filed on Apr. 11, 2002, which is a continuing application under 37 C.F.R. § 1.53(b) of application Ser. No. 09/568,676 filed on May 11, 2000, which issued as U.S. Pat. No. 6,400,574 on Jun. 4, 2002.

BACKGROUND OF THE INVENTION

1. Field of the Invention

The present invention relates generally to microelectronic packaging and, more particularly, to a method and apparatus for encapsulating a ball grid array (BGA) in a molding compound.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The packaging of electrical circuits is a key element in the technological development of any device containing electrical components. Several technologies have been developed to provide a means of mounting these electrical components on a surface of a substrate, such as a printed circuit board (PCB). Fine pitch surface mount (FPT), pin grid array (PGA), and ball grid array (BGA) are examples of leading surface mount technologies.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multilayer interconnect options; higher number of IO's for a given footprint; easier extension to multi-chip modules; and faster design-to-production cycle time.

A BGA semiconductor package generally includes a semiconductor chip mounted on the top surface of a substrate. The semiconductor chip may be electrically coupled to the substrate by bond wires. The substrate contains conductive routing which allows the signals to pass from the semiconductor chip on the top side of the substrate, through the substrate, and to pads on the backside of the substrate. A plurality of solder balls are deposited and electrically coupled to the pads on the backside of the substrate to be used as input/output terminals for electrically connecting the substrate to a PCB or other external device.

One problem with conventional BGA packaging is the need to protect the electrical interface between the chip and the substrate. To protect the semiconductor chip and bond wires from external elements such as moisture, dust, or impact, the semiconductor chip is often encapsulated in a molding compound. The implementation of the encapsulation process presents many challenges.

BRIEF DESCRIPTION OF THE DRAWINGS

Advantages and features of the invention may become apparent upon reading the following detailed description and upon reference to the drawings in which:

FIG. 7C illustrates a second alternate embodiment of the solder ball area illustrated in FIG. 6;

FIG. 7D illustrates a third alternate embodiment of the solder ball area illustrated in FIG. 6;

FIG. 9 illustrates a cross-sectional view of an encapsulated circuit package in accordance with another aspect of the present techniques;

FIG. 10 illustrates an enlarged view of the solder ball area illustrated in FIG. 9;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
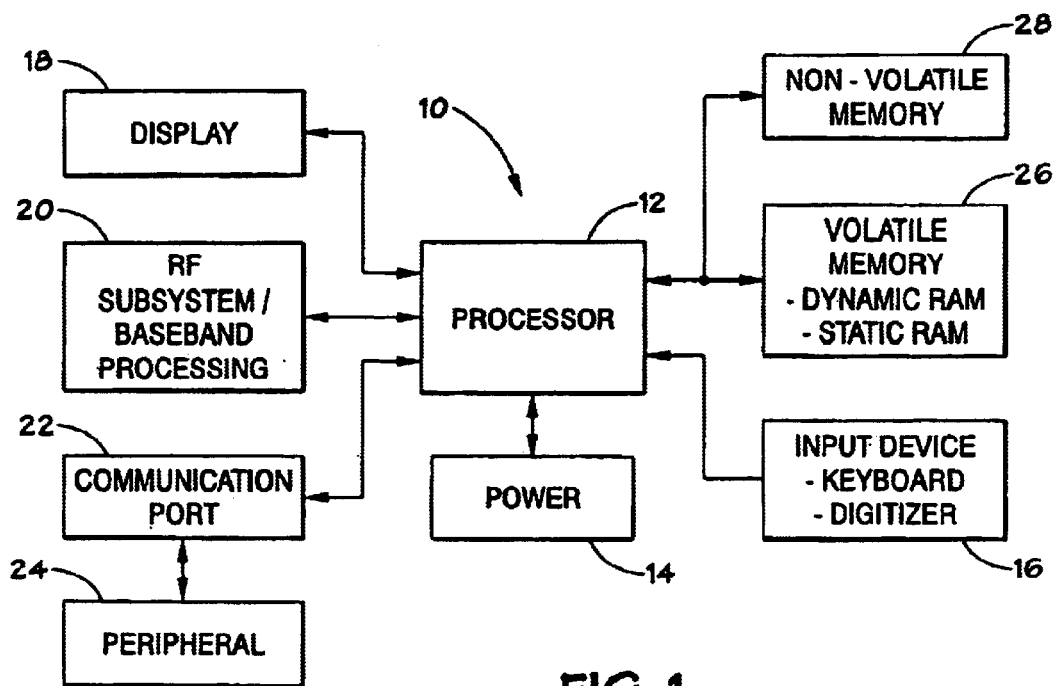
FIG. 1 illustrates a block diagram of an exemplary processor-based device in accordance with the present invention.

Turning now to the drawings, and referring initially to FIG. 1, a block diagram depicting an exemplary processor-based device generally designated by the reference numeral 10 is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so the device may be plugged into a wall outlet, for instance. In fact, the power supply 14 may also include a DC adapter, so that the device can be plugged into a vehicle cigarette lighter, for instance.

Various other devices may be coupled to the processor 12 depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port may be adapted to be coupled to a peripheral device 24, such as a modem, a printer, or a computer, for instance, or to a network, such as a local area network or the Internet, for instance. Volatile memory 26 and non-volatile memory 28 may also be coupled to the processor 12.

Figure 2:
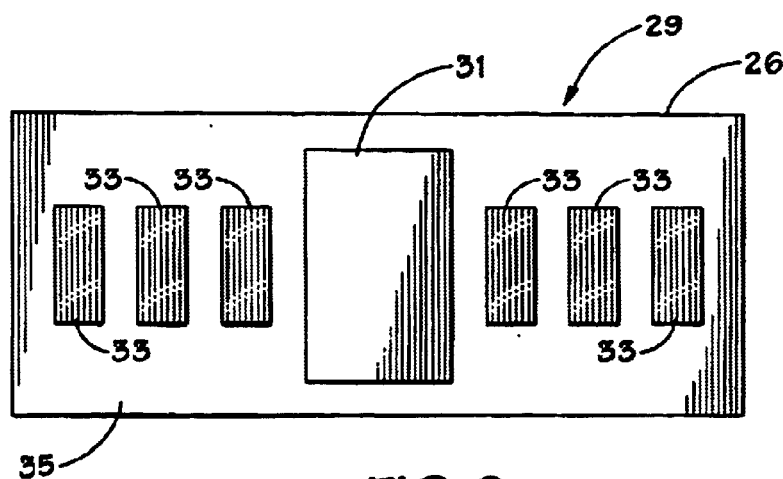
FIG. 2 illustrates an exemplary memory array.

FIG. 2 illustrates a multi-chip memory array 29. For the sake of clarity, elements similar to the elements previously described will be designated by like reference numerals. The memory array 29 may be illustrative of volatile memory 26 or non-volatile memory 28. In this arrangement, a memory controller 31 is coupled to a plurality of memory devices 33. The memory controller 31 and the memory devices 33 are mounted in a planar fashion on the same substrate 35, such as a printed circuit board. Disadvantageously, this planar layout allows for only a limited number of memory devices 33 to be used depending on the surface area of the substrate 35.

Figure 3:
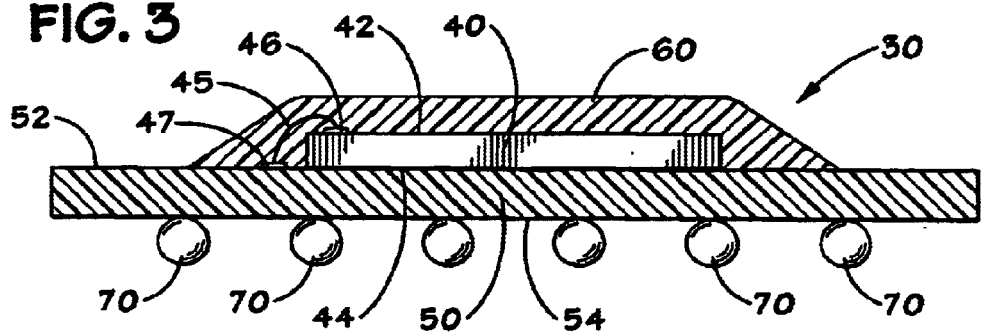
FIG. 3 illustrates an exemplary encapsulated circuit package.

FIG. 3 illustrates a partial cross-sectional view depicting an exemplary encapsulated circuit package 30. The circuit package 30 typically includes a semiconductor chip 40, such as a memory die. The semiconductor chip 40 is mounted on a substrate 50 and electrically coupled to the substrate 50 by bond wires 45. Bond wires 45 are attached to bond pads 46 on the first surface 42 of the semiconductor chip 40 and to bond pads 47 on the first surface 52 of the substrate 50. A molding compound 60 is generally used to encapsulate the semiconductor chip 40. The molding compound 60 protects the semiconductor chip 40 and the bond wires 45 from external elements. Terminals, such as pins or solder balls 70, may be disposed on the backside of the substrate 50 so that the circuit package 30 may be electrically coupled to a printed circuit board (PCB) to incorporate the circuit package 30 into a system. The substrate 50 also includes conductive routing and/or vias (not shown) to provide an electrical signal path from the solder pads 47 to the solder balls 70.

Figure 4:
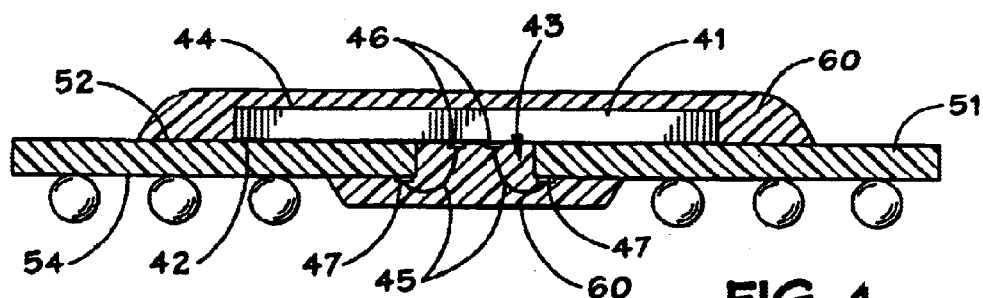
FIG. 4 illustrates a cross sectional view of a BOC package.

Alternately, a board-on-chip (BOC) circuit package may be encapsulated, with molding compound disposed on both surfaces of the substrate 51, as illustrated in FIG. 4. In this embodiment, the semiconductor chip 41 may be mounted with the first surface 42 of the semiconductor chip 41 placed in contact with the first surface 52 of the substrate 51. In this example, a slot 43 is formed in the substrate 51, and bond pads 46 on the first surface 42 of the semiconductor chip 41 are aligned so as to allow bond wires 45 to be attached to bond pads 46 on the first surface 42 of the semiconductor chip 41, and further attached to bond pads 47 on the second surface 54 of the substrate 51. During the encapsulation process, molding compound 60 may be disposed on the second surface 44 of the semiconductor chip 41 which is not in contact with the substrate 51 and may be disposed on the first surface 52 of the substrate 51. The molding compound 60 may be disposed through the slot 43 in the substrate 51 and on a portion of the second surface 54 of the substrate 51.

Figure 5:
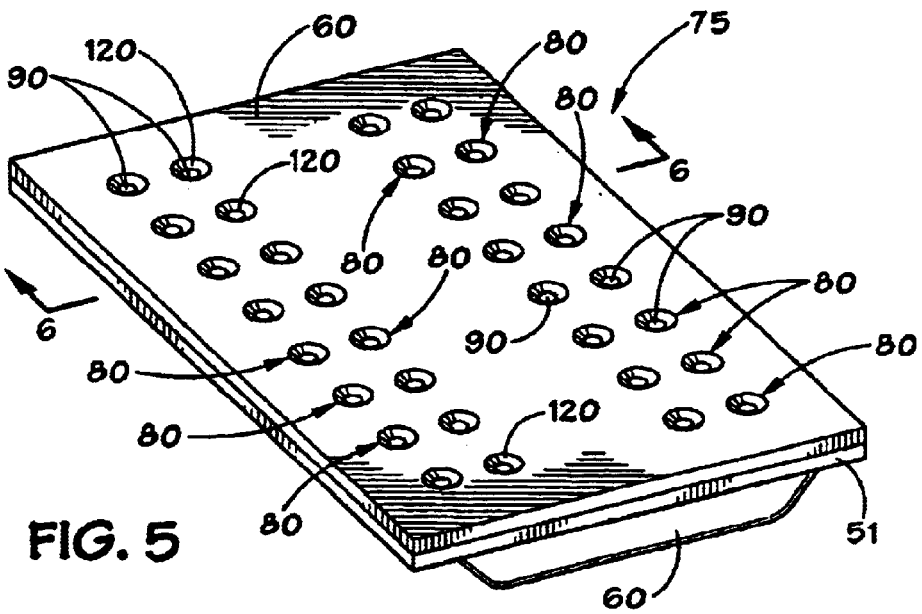
FIG. 5 illustrates an encapsulated circuit package in accordance with one aspect of the present techniques.

FIG. 5 illustrates an exemplary encapsulated circuit package 75 in accordance with one aspect of the present techniques. The molding compound 60 is used to encapsulate the entire circuit package 75, including the backside of the circuit package 75. The circuit package 75 is encapsulated with molding compound 60 in such a way as to provide openings in the molding compound 60 to allow the circuit package 75 to be coupled to a printed circuit board. In one example, cups 80 are formed in the molding compound 60. The cups 80 are configured to receive solder balls (not shown) which provide electrical coupling of the circuit package 75 to a printed circuit board. The cups 80 are configured to align with pads 90 which are coupled to the second surface of the substrate 50 contained within the molding compound 60.

Figure 6:
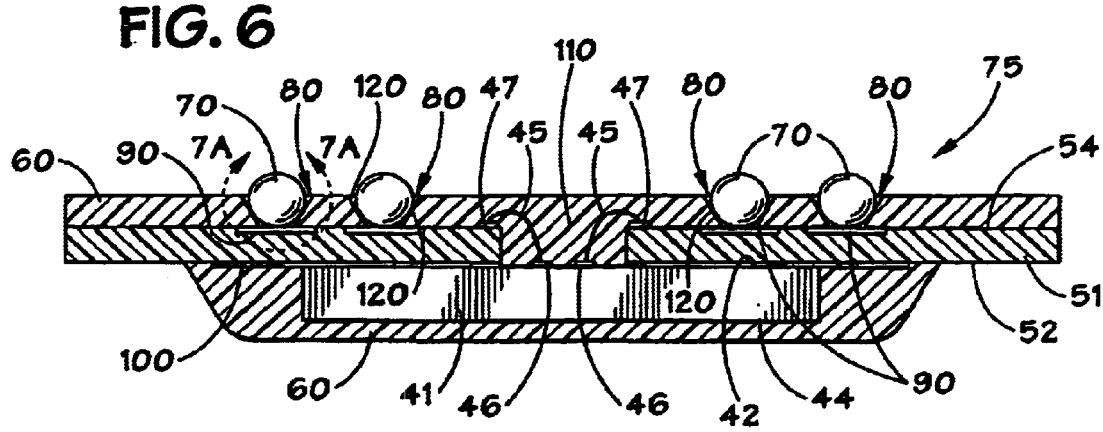
FIG. 6 illustrates a cross-sectional view of an encapsulated circuit package in accordance with one aspect of the present techniques, taken along line 6—6.

FIG. 6 illustrates a cross-sectional view of an encapsulated BOC circuit package 75 in accordance with one aspect of the present techniques, taken along line 6—6. As in FIG. 4, a semiconductor chip 41 is typically coupled to the substrate 51 by an adhesive 100, such as a dielectric tape or non-conductive paste. The first surface 42 of the semiconductor chip 41 is coupled to the first surface 52 of the substrate 51 by adhesive 100. The semiconductor chip 41 is electrically coupled to conductors of the substrate 51 by bond wires 45. The bond wires 45 are coupled to bond pads 46 located on the first surface 42 of the semiconductor chip 41 and further coupled to bond pads 47 on the second surface 54 of the substrate 51. In this BOC embodiment, the substrate 51 includes a slot 110 through which the bond wires 45 are attached. The circuit package 75 is encapsulated with the molding compound 60 which is deposited on the second surface 44 of the semiconductor chip 41, the first surface 52 of the substrate 51, through the slot 110 and onto the second surface 54 of the substrate 51. Cup openings 80 are configured to align with solder pads 90 on the second surface 54 of the substrate 51. The cups 80 advantageously have tapered walls 120 which facilitate alignment of the solder balls 70 with the solder pads 90.

Figure 7A:
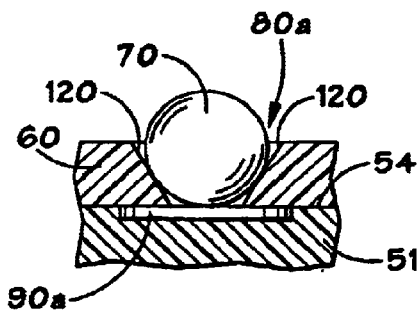
FIG. 7A illustrates an enlarged view of the solder ball area illustrated in FIG. 6.

FIG. 7A illustrates an enlarged view of the solder ball area illustrated in FIG. 6. The cup 80a in the molding compound 60 is configured such that the base of the cup is smaller than the solder pad 90a. Thus, the solder mask used to dispense the solder balls 70 determine the solder ball 70 location. The tapered walls 120 allow for proper alignment of the solder ball 70 over the solder pad 90a. Alternately, the cup 80a may be a hemisphere sized to hold a solder ball 70 as illustrated in FIG. 7C. FIG. 7C illustrates a hemispherical cup 80c wherein the solder ball 70 is electrically coupled to the solder pad 90c. Further, the cup 80a may be cylindrical in shape as illustrated in FIG. 7D. FIG. 7D illustrates a cylindrical cup 80d wherein the solder ball 70 is electrically coupled to the solder pad 90d. The solder pad 90a is coupled to the second surface 54 of the substrate 51 to provide electrical coupling of the solder balls 70 to the substrate 51.

Figure 7B:
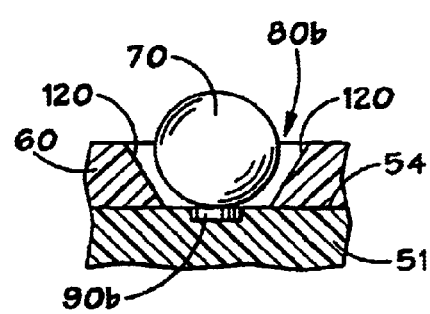
FIG. 7B illustrates a first alternate embodiment of the solder ball area illustrated in FIG. 6.

FIG. 7B illustrates an alternate embodiment of the solder ball area illustrated in FIG. 6. Here, the cup 80b contained within the molding compound 60 is configured such that the opening is larger than the solder pad 90b. While the tapered walls 120 in the cup 80b may direct the alignment of the solder ball 70 within the cup 80b, it is the location of the solder pad 90b which actually determines the exact placement of the solder ball 70, because the solder ball 70 will be attracted to the wetted solder pad 90b during the re-flow process that couples the solder ball 70 to the substrate 51. Again, solder pad 90b is coupled to the second surface 54 of substrate 51 to provide for electrical coupling between the solder ball 70 and the substrate 51.

Figure 8:
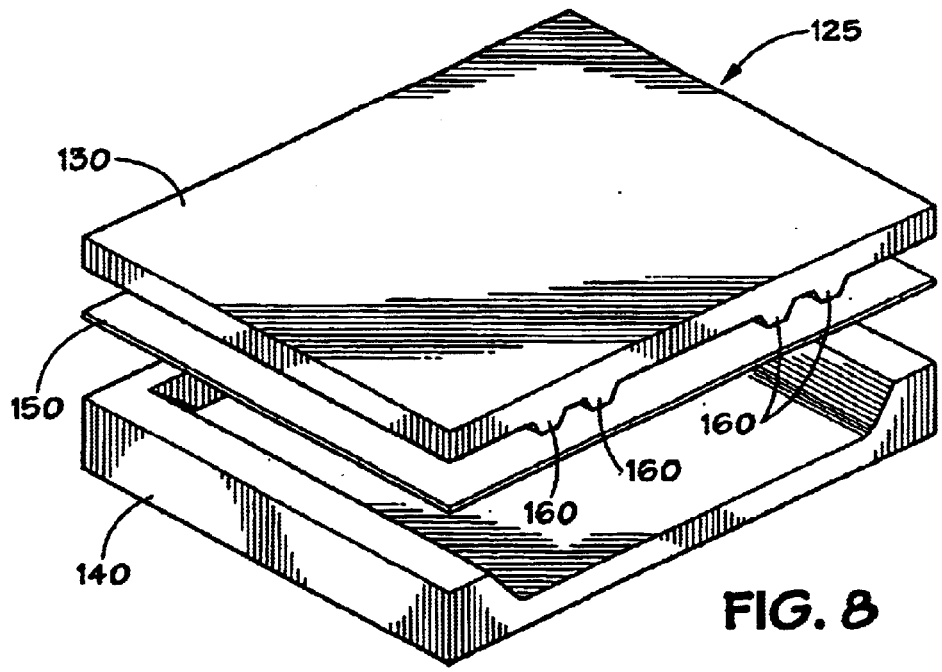
FIG. 8 illustrates an exploded view of an exemplary mold used to create the encapsulated circuit package illustrated in FIG. 5.

FIG. 8 illustrates an exploded view of a mold 125, which may include an upper mold 130 and a lower mold 140 used to create an encapsulated circuit package in accordance with the first aspect of the present techniques, illustrated with reference to FIGS. 5, 6, 7A and 7B. During the encapsulation process, the circuit package 75 is placed between the upper mold 130 and the lower mold 140. A release liner 150 may be used to provide separation of the circuit package 75 from the upper mold 130 after the encapsulation process is complete. The upper mold 130 includes a plurality of protrusions 160 which are brought in contact with the solder pads (not shown) on the second surface 54 of substrate 51. The protrusions 160 may be tapered to create the tapered walls of the cups 80, as shown in FIGS. 5–7B. During the molding process, the protrusions 160 of the upper mold 130 are brought in contact with the solder pads 90 (separated by release liner 150, if used). The second surface 54 of the substrate 51 is brought in contact with the upper mold 130, while the first surface 52 of the substrate 50 is brought in contact with the lower mold 140. A molding compound is then injected into an opening (not shown) in the molds 130 and 140. Once the molding compound hardens, the circuit package 75 is separated from the molds 130 and 140. The resulting circuit package 75 is encapsulated and includes the alignment cups used for solder ball deposition as described above.

As previously described, FIGS. 5–8 illustrate a technique for fabricating a molded ball grid array by encapsulating the device before disposing the solder balls. FIGS. 9–12 illustrate a second aspect of the present techniques, wherein the solder balls are disposed before the encapsulation process. Specifically, FIG. 9 illustrates a cross-sectional view of an encapsulated package, such as a BOC package 162, wherein the solder balls 70 are attached to the second surface 54 of the substrate 51 before the package 162 is encapsulated. As previously described with reference to FIG. 6, a semiconductor chip 41 is typically coupled to the substrate 51 by an adhesive 100. The semiconductor chip 41 is electrically coupled to conductors of the substrate by bond wires 45, for example. The bond wires 45 are coupled to bond pads 46 located on the first surface 42 of the semiconductor chip 41 and further coupled to bond pads 47 on the second surface 54 of the substrate 51. In this embodiment of the package 162, the substrate 51 includes a slot 110 through which the bond wires 45 are attached. After the solder balls 70 are coupled to the solder pads 90, the package 162 is encapsulated with an encapsulant 164 such as a liquid plastic, resin, or molding compound.

FIG. 10 illustrates an enlarged view of the solder ball area illustrated in FIG. 9. Because the solder balls 70 are coupled to the solder pads 90 before the deposition of the encapsulant 164, there are no cups formed in the encapsulant 164 in which to deposit the solder ball 70, as with the first exemplary technique described with reference to FIGS. 5–8. Instead, the shape of the encapsulant 164 is determined by the molds used to encapsulate the package 162 (illustrated in FIG. 11) and the solder balls 70. As indicated in FIG. 10, the encapsulant 164 may encase more than 50% of the solder ball 70. In one exemplary embodiment, the solder ball diameter D may be about 0.4 mm. After the encapsulation process, a portion of the solder ball 70 may protrude away from the surface of the encapsulant 164. The protruding portion of the solder ball 70 provides a conductive contact such that the package 162 may be electrically coupled to a system, as previously described.

In the present exemplary embodiment, the protruding portion of the solder ball 70 may have a height H of about 0.15 mm with respect to the surface of the encapsulant 164. As can be appreciated, the diameter of the solder balls 70 and the height of the protrusion may vary, depending on the specific application. Further, the amount of the solder balls 70 that is encapsulated may be also vary. For instance, the encapsulant 164 may be disposed to cover an amount of the surface area of the solder ball 70 defined by about 40% to about 85% of the diameter D of the solder ball 70 and more typically, about 50% to about 70%. According to the present dimensions, a surface area defined by approximately 62% of the diameter of the solder ball 70 is encapsulated in the present exemplary embodiment.

Figure 11:
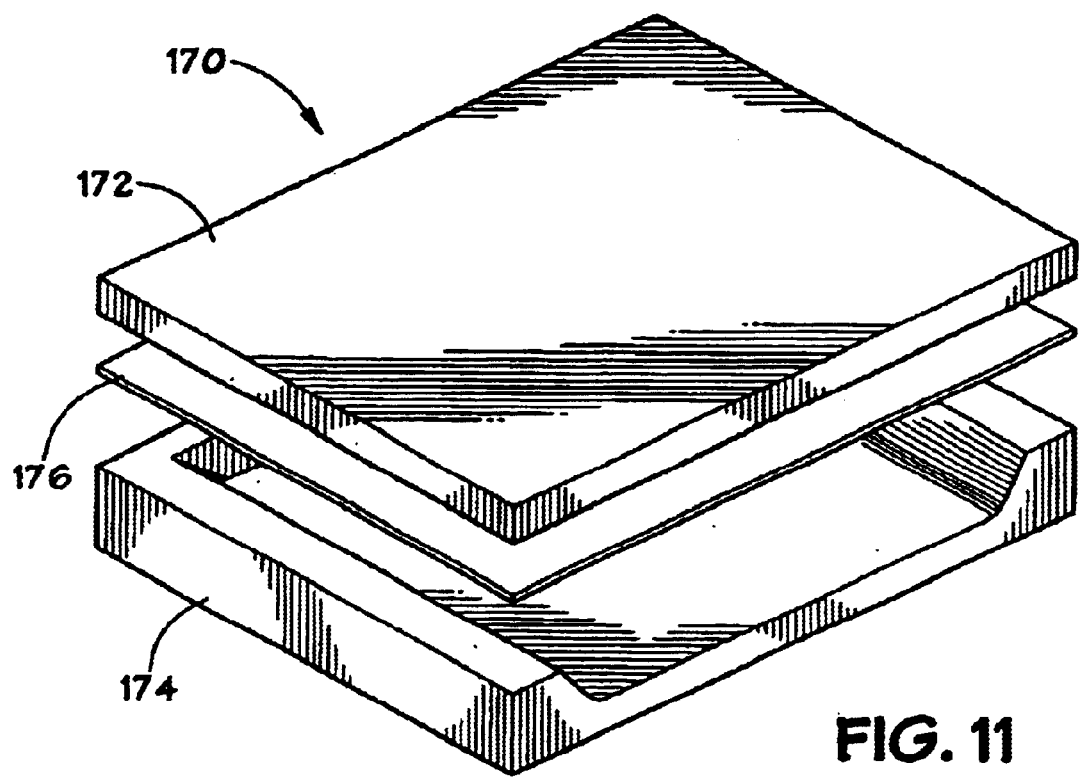
FIG. 11 illustrates an exploded view of an exemplary mold used to create the encapsulated circuit package illustrated in FIG. 9.

FIG. 11 illustrates an exploded view of a mold 170, which may include an upper mold 172 and a lower mold 174 used to create the encapsulated circuit package 162. During the encapsulation process, the circuit package 162 is placed between the upper mold 172 and the lower mold 174. A liner 176 is provided to facilitate the formation of the encapsulant 164 about the solder balls 70 such that a portion of the solder balls 70 is left exposed after the encapsulation process. The liner 176 comprises a compliant film, such as a fluoropolymer film or an ethylene tetrafluoroethylene copolymer film, for example. The compression ratio of the liner 176 coincides with the protruding portion of the solder ball 70. The liner 176 prevents coverage of the entire solder ball 70 during the encapsulation process by conforming around a portion of the solder ball 70 during in the encapsulation process, thereby creating a protruding portion of the solder ball 70 which is blocked from receiving the encapsulant 164. In one exemplary embodiment, the liner 176 may have a thickness of about 0.3 mm and have a compression ratio that allows the encapsulation of the surface of the solder ball 70 defined by about 40% to about 85% of the diameter D of the solder ball 70 and more specifically, about 50% to about 70%. Accordingly, after the encapsulation process a protruding (unencapsulated) portion of the solder ball is created. Alternatively, the upper mold 172 may comprise the liner 176. That is to say, the upper mold 172 has a resilient layer that is conformally compressed about the solder balls 70 when the solder balls are pressed into contact with the upper mold 172.

Figure 12:
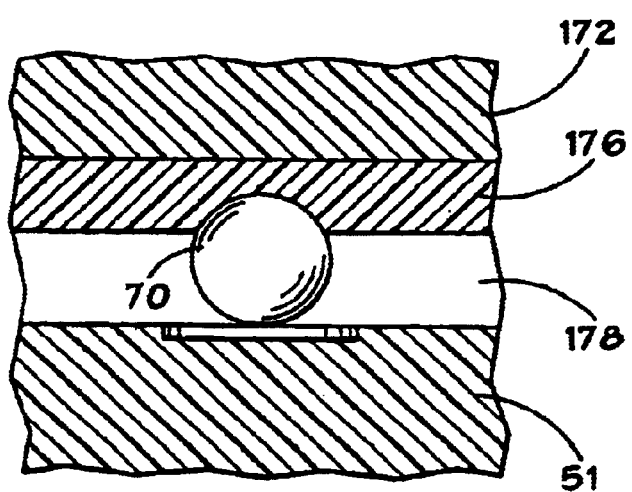
FIG. 12 illustrates an enlarged cross-sectional view of the solder ball area during the encapsulation process in accordance with the embodiment illustrated in FIG. 9.

FIG. 12 illustrates an enlarged view of the solder ball area during the encapsulation process. As can be appreciated, the upper mold 172 presses the liner 176 into contact with the solder ball 70. The liner 176 is compressed by the solder ball 70 and conforms to the shape of the solder ball 70. Thus, a portion of the solder ball 70 is completely covered by the liner 176. During the encapsulation process, the cavity 178 is filled with encapsulant 164 The liner 176 will prevent the encapsulant 164 from encapsulating the top, covered portion of the solder ball 70. In the present exemplary embodiment, the liner 176 has a compression ratio that allows a surface area defined by about 35% of the diameter D of the solder bail 70 to remain uneucapsulated. As can be appreciated, the thickness, material and/or compression ratio of the liner 176 may be selected to provide a desirable coverage area.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a circuit package comprising a substrate, the method comprising the acts of:
   coupling a plurality of conductive balls to the substrate;
   disposing the substrate between an upper mold and a lower mold;
   disposing a liner over the substrate such that the conductive balls are brought in direct contact with the liner;
   disposing an encapsulant onto the substrate and about a portion of the conductive balls such that the encapsulant conformally contacts the conductive balls; and
   applying a force to one of the liner and the substrate such that the conductive balls compress the liner, wherein the amount of compression defines a portion of the conductive balls about which the encapsulant is not disposed.

2. The method, as set forth in claim 1, wherein the act of coupling comprises the act of coupling a plurality of solder balls to the substrate.

3. The method, as set forth in claim 1, wherein the act of coupling comprises the act of coupling a plurality of conductive balls to the substrate, wherein the conductive balls have a diameter of about 0.4 mm.

4. The method, as set forth in claim 1, wherein the act of disposing comprises the act of disposing the encapsulant about a portion of the conductive balls, wherein the portion is a surface area defined by about 40% to about 85% of the diameter of the conductive balls.

5. The method, as set forth in claim 1, wherein the act of disposing comprises the act of disposing the encapsulant about a portion of the conductive balls, wherein the portion is a surface area defined by about 50% to about 70% of the diameter of the conductive balls.

6. The method, as set forth in claim 1, wherein the act of disposing comprises the act of disposing the encapsulant about a portion of the conductive balls, wherein the portion is a surface area defined by greater than 50% of the diameter of the conductive balls.

7. The method, as set forth in claim 1, comprising the act of coupling a semiconductor device to the substrate.

8. The method, as set forth in claim 1, wherein the act of disposing a liner comprises the act of disposing a liner having a thickness of about 0.3 mm.

9. The method, as set forth in claim 1, wherein the act of disposing a liner comprises the act of disposing a fluoropolymer film.

10. The method, as set forth in claim 1, wherein the act of disposing a liner comprises the act of disposing an ethylene tetrafluoroethylene copolymer film.

11. A method of molding a circuit package comprising the acts of:
    disposing a first mold adjacent to a circuit package, wherein the circuit package comprises conductive balls coupled to a substrate;
    disposing a liner over the substrate and the conductive balls;
    pressing the circuit package and the liner together such that the liner is conformally compressed by the conductive balls, wherein the liner conformally covers a portion of the surface area of the conductive balls; and
    disposing an encapsulant about a portion of the conductive balls not conformally covered by the liner.

12. The method, as set forth in claim 11, wherein the act of disposing a liner comprises the act of disposing a liner having a thickness of about 0.3 mm.

13. The method, as set forth in claim 11, wherein the act of disposing a liner comprises the act of disposing a fluoropolymer film.

14. The method, as set forth in claim 11, wherein the act of disposing a liner comprises the act of disposing an ethylene tetrafluoroethylene copolymer film.

15. The method, as set forth in claim 11, wherein the act of disposing a liner comprises the act of disposing a second mold having a resilient surface.

16. The method, as set forth in claim 11, wherein the act of disposing an encapsulant comprises the act of disposing the encapsulant about a portion of the conductive balls, wherein the portion is a surface area defined by about 40% to about 85% of the diameter of the conductive balls.

17. The method, as set forth in claim 11, wherein the act of disposing an encapsulant comprises the act of disposing the encapsulant about a portion of the conductive balls, wherein the portion is a surface area defined by about 50% to about 70% of the diameter of the conductive balls.

18. The method, as set forth in claim 11, wherein the act of disposing an encapsulant comprises the act of disposing the encapsulant about a portion of the conductive balls, wherein the portion is a surface area defined by greater than 50% of the diameter of the conductive balls.

19. The method, as set forth in claim 11, wherein the act of disposing an encapsulant comprises the act of injecting the encapsulant.

20. A method of fabricating a circuit package comprising a semiconductor device and a substrate, the method comprising:
    coupling the semiconductor device to a first side of the substrate;
    coupling a plurality of conductive balls to a second side of the substrate;
    disposing a liner over the substrate such that the conductive balls are brought in direct contact with the liner;
    disposing an encapsulant onto the second side of the substrate and about a portion of the conductive balls such that the encapsulant conformally contacts the conductive balls; and
    applying force to one of the liner or the substrate such that the conductive balls compress the liner, wherein the amount of compression defines a portion of the conductive balls about which the encapsulant is not disposed.

21. The method, as set forth in claim 20, wherein coupling the plurality of conductive balls comprises coupling a plurality of solder balls to the substrate.

22. The method, as set forth in claim 20, wherein coupling the plurality of conductive balls comprises coupling a plurality of conductive balls to the substrate, wherein the conductive balls have a diameter of about 0.4 mm.

23. The method, as set forth in claim 20, wherein disposing comprises disposing the encapsulant about a portion of the conductive balls, wherein the portion is a surface area defined by about 40% to about 85% of the diameter of the conductive balls.

24. The method, as set forth in claim 20, wherein disposing comprises disposing the encapsulant about a portion of the conductive balls, wherein the portion is a surface area defined by about 50% to about 70% of the diameter of the conductive balls.

25. The method, as set forth in claim 20, wherein disposing comprises disposing the encapsulant about a portion of the conductive balls, wherein the portion is a surface area defined by greater than 50% of the diameter of the conductive balls.

26. The method, as set forth in claim 20, wherein disposing a liner comprises the act of disposing a liner having a thickness of about 0.3 mm.

27. The method, as set forth in claim 20, wherein disposing a liner comprises disposing a fluoropolymer film.

* * * * *